(12) United States Patent  
Deguchi

(10) Patent No.: US 7,898,349 B2  
(45) Date of Patent: Mar. 1, 2011

(54) TRIANGULAR WAVE GENERATING CIRCUIT, AND CHARGING AND DISCHARGING CONTROL CIRCUIT

(75) Inventor: Michiyasu Deguchi, Chiba (JP)

(73) Assignee: Seiko Instruments Inc. (JP)

( * ) Notice: Subject to any disclaimer, the term of this patent is extended or adjusted under 35 U.S.C. 154(b) by 384 days.

(21) Appl. No.: 12/070,695

(22) Filed: Feb. 20, 2008

(65) Prior Publication Data

US 2008/0218283 A1  Sep. 11, 2008

(30) Foreign Application Priority Data

Feb. 21, 2007  (JP)  ............... 2007-040569

(51) Int. Cl.
*H03K 3/26*  (2006.01)
*H03K 3/02*  (2006.01)

(52) U.S. Cl. ...................... 331/111; 331/143

(58) Field of Classification Search .......... 331/111, 331/143, 185

See application file for complete search history.

(56) References Cited

U.S. PATENT DOCUMENTS 5,638,031 A * 6/1997 Danstrom ............ 331/111

6,271,735 B1 * 8/2001 Halamik et al. ............ 331/111

FOREIGN PATENT DOCUMENTS

JP  2004253868  9/2004

* cited by examiner

*Primary Examiner*—Robert Pascal
*Assistant Examiner*—Ryan Johnson
(74) *Attorney, Agent, or Firm*—Adams & Wilks

(57) ABSTRACT

A charging and discharging circuit of a triangular wave oscillation circuit includes an inverter circuit; a discharging reference potential generating circuit; a first NMOS transistor having a drain connected with a connection point between a first current source circuit and the capacitor, and a gate connected with the discharging reference potential generated by the discharging reference potential generating circuit; a second NMOS transistor having a gate inputted with the switching signal through the inverter circuit, a drain connected with the gate of the first NMOS transistor, and a source connected with a source of the first NMOS transistor; and a third NMOS transistor having a gate inputted with the switching signal, a drain connected with a connection point between the source of the first NMOS transistor and the source of the second NMOS transistor, and a source grounded.

4 Claims, 6 Drawing Sheets

TRIANGULAR WAVE GENERATING CIRCUIT, AND CHARGING AND DISCHARGING CONTROL CIRCUIT

BACKGROUND OF THE INVENTION

1. Field of the Invention

The present invention relates to a triangular wave generating circuit, and more particularly, to a triangular wave generating circuit for charging a capacitor with a constant current and comparing a charging potential thereof with a reference potential by a comparator to control charging and discharging of the capacitor.

2. Description of the Related Art

There has been known a device for obtaining a triangular wave using a method of charging a capacitor with a constant current and comparing a charging potential thereof with a reference potential by a comparator to control charging and discharging of the capacitor (hereinafter referred to as a triangular wave generating circuit) (see JP 2004-253868 A).

In the triangular wave generating circuit, examples of the reference voltage include a high potential (hereinafter referred to as a reference voltage VH) and a low potential (hereinafter referred to as a reference voltage VL). Any one of the reference voltage VH and the reference voltage VL is selected by a selector for selecting any one of the reference voltage VH and the reference voltage VL as the reference voltage. The selected reference voltage is inputted to the comparator.

When the reference voltage VH is being inputted to the comparator in the triangular wave generating circuit, the capacitor is in a charging phase. Then, when the potential of the capacitor reaches the reference voltage VH, the comparator responds to this, so control is performed so as to discharge charges from the capacitor. The reference voltage inputted to the comparator is switched to the reference voltage VL.

When the potential of the capacitor reduces to the reference voltage VL because of discharging, the comparator responds to this again, so control is performed so as to charge the capacitor. The reference voltage inputted to the comparator is switched to the reference voltage VH.

The triangular wave generating circuit repeats the above-mentioned operation to generate a triangular wave.

Next, the triangular wave generating circuit described in JP 2004-253868 A will be described in detail with reference to FIGS. 3 and 4.

A structure of a triangular wave generating circuit 1 will be described with reference to FIG. 3. The triangular wave generating circuit 1 includes a current source circuit 2 for generating a current proportional to a power supply voltage, a capacitor 3, a charging and discharging circuit 4, a reference voltage circuit 5 for generating a first reference voltage VH proportional to the power supply voltage and a second reference voltage VL proportional to the power supply voltage, a comparator circuit 6, a switch control circuit (SW control circuit) 7, a first switch circuit (SW1 circuit) 8, a second switch circuit (SW2 circuit) 9, and an output terminal OUT. A triangular wave signal is outputted from the output terminal OUT. In FIG. 3, reference symbols "A", "B", "E", "F", "G", and "J" denote signal wirings. Hereinafter, potentials on the respective signal wirings are expressed by VA, VB, VE, VF, VG, and VJ. Signals traveling in the respective signal wirings are expressed by ΦA, ΦB, ΦE, ΦF, ΦG, and ΦJ.

In the structure of FIG. 3, the current source circuit 2 is a circuit for generating the current proportional to the power supply voltage. The current generated by the current source circuit 2 is outputted to the charging and discharging circuit 4 through the signal wiring "A" to specify a charging current or a discharging current which is generated by the charging and discharging circuit 4. The capacitor 3 is charged or discharged with the charging current or the discharging current generated by the charging and discharging circuit 4. A voltage terminal of the capacitor 3 is connected with the output terminal OUT and a non-inverting input terminal (one of two input terminals) of the comparator circuit 6. The reference voltage circuit 5 generates the first reference voltage VH proportional to the power supply voltage and the second reference voltage VL proportional to the power supply voltage. Assume that the first reference voltage VH is higher than the second reference voltage VL. The first reference voltage VH and the second reference voltage VL are inputted to the second switch circuit 9. An output terminal of the second switch circuit 9 is connected with an inverting input terminal (the other of the two input terminals) of the comparator circuit 6. An output terminal of the comparator circuit 6 is connected with an input terminal of the switch control circuit 7. One of two output terminals of the switch control circuit 7 is connected with an input terminal of the first switch circuit 8 and the other thereof is connected with an input terminal of the second switch circuit 9. An output terminal of the first switch circuit 8 is connected with the charging and discharging circuit 4 to switch between charging and discharging using the charging and discharging circuit 4. The output terminal of the second switch circuit 9 is connected with the inverting input terminal (the other of the two input terminals) of the comparator circuit 6 to switch the voltage VE on the signal wiring "E" between the first reference voltage VH and the second reference voltage VL.

Next, the operation of each of the circuits of FIG. 3 will be described. Assume that VDD denotes the power supply voltage and VSS denotes a ground voltage. The current generated by the current source circuit 2 is expressed by I2. The current I2 changes proportional to the power supply voltage.

The current I2 generated by the current source circuit 2 is outputted to the charging and discharging circuit 4 through the signal wiring "A" to specify the charging current or the discharging current which is generated by the charging and discharging circuit 4. Each of the charging current and the discharging current which is generated by the charging and discharging circuit 4 is expressed by I4. At the time of charging, charges are stored in the capacitor 3 by the charging current I4 to increase the voltage of the capacitor 3, that is, a voltage VOUT at the output terminal OUT.

The comparator circuit 6 compares the voltage VE on the signal wiring "E" which is inputted to the inverting input terminal with the voltage VOUT inputted to the non-inverting input terminal to generate the signal ΦF. The signal ΦF outputted from the comparator circuit 6 becomes a low level when VOUT<VE and becomes a high level when VOUT>VE. The high level indicates that the potential is VDD and the low level indicates that the potential is VSS. The signal ΦF outputted from the comparator circuit 6 is inputted to the switch control circuit 7.

The switch control circuit 7 generates the signals ΦG and ΦJ based on the signal ΦF outputted from the comparator circuit 6. When the signal ΦF is in the low level, the signal ΦG becomes the high level. When the signal ΦF is in the high level, the signal ΦG becomes the low level. On the other hand, when the signal ΦF is in the low level, the signal ΦJ becomes the low level. When the signal ΦF is in the high level, the signal ΦJ becomes the high level.

The signal ΦG outputted from the switch control circuit 7 is inputted to the first switch circuit 8. The first switch circuit 8 switches between the charging and discharging using the charging and discharging circuit 4. When the signal ΦG is in the high level, the charging and discharging circuit 4 charges the capacitor 3. When the signal ΦG is in the low level, the charging and discharging circuit 4 discharges the capacitor 3.

The reference voltage circuit 5 generates the first reference voltage VH and the second reference voltage VL. Each of the first reference voltage VH and the second reference voltage VL changes proportional to the power supply voltage. The first reference voltage VH and the second reference voltage VL are inputted to the second switch circuit 9. The signal ΦJ for switch control is inputted to the second switch circuit 9 to switch the voltage VE on the signal wiring "E" between the first reference voltage VH and the second reference voltage VL. The second switch circuit 9 is operated such that VE=VH when the signal ΦJ is in the low level and VE=VL when the signal ΦJ is in the high level. The voltage on the signal wiring "E" which is outputted from the second switch circuit 9 is inputted to the inverting input terminal of the comparator circuit 6.

Next, the operation of the triangular wave generating circuit 1 having the above-mentioned structure as shown in FIG. 3 will be described.

When VOUT<VE, the signal ΦF outputted from the comparator circuit 6 becomes the low level. Then, the signal ΦG outputted from the switch control circuit 7 becomes the high level and the signal ΦJ outputted therefrom becomes the low level. When the signal ΦJ is in the low level, the second switch circuit 9 is controlled such that VE=VH. When the signal ΦG is in the high level, the first switch circuit 8 is controlled such that the capacitor 3 is charged by the charging and discharging circuit 4. Therefore, the charges are stored in the capacitor 3 by the charging current I4. The voltage of the capacitor 3, that is, the voltage VOUT at the output terminal OUT increases with the lapse of time. When the voltage VOUT at the output terminal OUT increases and thus becomes higher than VE (=VH), the signal ΦF outputted from the comparator circuit 6 is changed from the low level to the high level because VOUT>VE. When the signal ΦF is changed to the high level, the signal ΦG is changed from the high level to the low level and the signal ΦJ is changed from the low level to the high level. When the signal ΦJ is in the high level, the second switch circuit 9 is controlled such that VE=VL. When the signal ΦG is in the low level, the first switch circuit 8 is controlled such that the capacitor 3 is discharged by the charging and discharging circuit 4. Therefore, the charges stored in the capacitor 3 are discharged by the discharging current I4. The voltage of the capacitor 3, that is, the voltage VOUT at the output terminal OUT reduces with the lapse of time. When the voltage VOUT at the output terminal OUT reduces and thus becomes lower than VE (=VL), the voltage VOUT increases with the lapse of time as described above because VOUT<VE. Hereinafter, such an operation is repeated to change the voltage VOUT into a triangular wave.

Next, a circuit example corresponding to the structure of the triangular wave generating circuit 1 shown in FIG. 3 will be described with reference to FIG. 4. Elements indicated by reference numerals 1 to 9 and respective wirings of FIG. 4 correspond to the elements indicated by reference numerals 1 to 9 and the respective wirings of FIG. 3. The operation of each of the circuits (including the capacitor) 1 to 9 shown in FIG. 4 in response to the signals on the respective wirings corresponds to the operation of each of the circuits (including the capacitor) shown in FIG. 3. In FIG. 4, reference numeral 10 denotes a power supply voltage terminal and reference numeral 11 denotes a ground voltage terminal. The power supply voltage is expressed by VDD and the ground voltage is expressed by VSS (=GND).

The current source circuit 2 shown in FIG. 4 includes resistors 21, 22, and 26, an operational amplifier 23, a PMOS transistor 24, and an NMOS transistor 25. The resistors 21 and 22 are connected in series. A connection point K between first terminals of the resistors 21 and 22 is connected with a non-inverting input terminal of the operational amplifier 23. A second terminal of the resistor 21 is connected with the power supply voltage terminal 10. A second terminal of the resistor 22 is connected with the ground voltage terminal 11. An output terminal of the operational amplifier 23 is connected with a gate of the NMOS transistor 25. A source of the NMOS transistor 25 is connected with a first terminal of the resistor 26 and an inverting input terminal of the operational amplifier 23 at a connection point M. A drain of the NMOS transistor 25 is connected with a drain of the PMOS transistor 24. A second terminal of the resistor 26 is connected with the ground voltage terminal 11. A source of the PMOS transistor 24 is connected with the power supply voltage terminal 10 and a gate thereof is connected with the drain thereof.

The charging and discharging circuit 4 shown in FIG. 4 includes PMOS transistors 41 and 42 and NMOS transistors 43, 44, and 45. The PMOS transistors 41 and 42 are equal in size to each other. The NMOS transistors 43, 44, and 45 are equal in size to one another. Gates of the PMOS transistors 41 and 42 are connected common to each other and connected with the gate of the PMOS transistor 24 of the current source circuit 2 through the wiring "A". Respective sources of the PMOS transistors 41 and 42 are connected with the power supply voltage terminal 10. Gates of the NMOS transistors 43, 44, and 45 are connected common to one another and connected with a drain of the NMOS transistors 43. Respective sources of the NMOS transistors 43, 44, and 45 are connected with the ground voltage terminal 11. A drain of the PMOS transistor 41 is connected with the drain of the NMOS transistors 43. A drain of the PMOS transistor 42 is connected with drains of the NMOS transistors 44 and 45.

The first switch circuit 8 shown in FIG. 4 includes an NMOS transistor 81. A drain of the NMOS transistor 81 is connected with the drain of the NMOS transistor 43 of the charging and discharging circuit 4 through the wiring "B". A source of the NMOS transistor 81 is connected with the ground voltage terminal 11 and a gate thereof is inputted with the signal ΦF on the wiring "F".

The capacitor 3 shown in FIG. 4 is a capacitor 31. A first terminal of the capacitor 31 is connected with the drain of the PMOS transistor 42. A second terminal of the capacitor 31 is connected with the ground voltage terminal 11. The first terminal of the capacitor 31 which is connected with the drain of the PMOS transistor 42 is expressed by OUT.

The comparator circuit 6 shown in FIG. 4 is a comparator circuit 61. An inverting input terminal of the comparator circuit 61 is connected with the wiring "E" and a non-inverting input terminal thereof is connected with the first terminal OUT of the capacitor 31. The comparator circuit 61 compares the voltage VE inputted to the inverting input terminal with the voltage VOUT inputted to the non-inverting input terminal to output the signal ΦF to the wiring "F". When VOUT<VE, the signal ΦF outputted from the comparator circuit 6 becomes the low level. When VOUT>VE, the signal ΦF becomes the high level. The signal ΦF outputted from the comparator circuit 6 is inputted to the switch control circuit 7 through the wiring "F".

The switch control circuit 7 shown in FIG. 4 includes a constant current source 71, an NMOS transistor 72, and inverters 73, 74, and 75. A first terminal of the constant current source 71 is connected with the power supply voltage terminal 10 and a second terminal thereof is connected with a drain of the NMOS transistor 72. A gate of the NMOS transistor 72 is connected with the wiring "F" and a source thereof is connected with the ground voltage terminal 11. The drain of the NMOS transistor 72 is connected with an input terminal of the inverter 73. An output terminal of the inverter 73 is connected with an input terminal of the inverter 74. An output terminal of the inverter 74 is connected with an input terminal of the inverter 75. The output terminal of the inverter 74 is connected with the wiring "G". An output terminal of the inverter 75 is connected with the wiring "J".

The reference voltage circuit 5 shown in FIG. 4 includes resistors 51, 52, and 53. The resistors 51, 52, and 53 are connected in series. A first terminal of the resistor 51 is connected with the power supply voltage terminal 10 and a second terminal thereof is connected with a first terminal of the resistor 52. A first terminal of the resistor 53 is connected with the ground voltage terminal 11 and a second terminal thereof is connected with a second terminal of the resistor 52. A connection point between the resistors 51 and 52 is connected with the wiring "H". A connection point between the resistors 52 and 53 is connected with the wiring "L".

The second switch circuit 9 shown in FIG. 4 includes a PMOS transistor 91 and an NMOS transistor 92. A gate of the PMOS transistor 91 and a gate of the NMOS transistor 92 are connected common to each other and connected with the wiring "J". A source of the PMOS transistor 91 and a source of the NMOS transistor 92 are connected common to each other and connected with the wiring "E". A drain of the PMOS transistor 91 is connected with the wiring "H". A drain of the NMOS transistor 92 is connected with the wiring "L".

As described above, the circuits (including the capacitor) 1 to 9 are constructed as shown in FIG. 4 and each of the circuits 2 to 9 operates as in the case of the operation of each of the circuits 2 to 9 shown in FIG. 3. Therefore, the triangular wave generating circuit 1 shown in FIG. 4 operates as a triangular wave generating circuit as in the case of the triangular wave generating circuit 1 shown in FIG. 3.

Next, the operation of a circuit which includes the current source circuit 2, the charging and discharging circuit 4, the first switch circuit 8, and the capacitor 3, which is related to an embodiment of the present invention will be described in detail with reference to FIG. 4.

Because the PMOS transistors 41 and 42 are equal in size to each other and the gates thereof are connected common to each other, the same magnitude of current flows into each of the PMOS transistors 41 and 42. The current (magnitude) is expressed by I4. Each of a combination of the PMOS transistors 24 and 41 and a combination of the PMOS transistors 24 and 42 is assumed to be configured as a current mirror circuit. Therefore, when the current flowing into the PMOS transistor 24 is expressed by I2 and a current mirror ratio is expressed by α, a relationship between the currents flowing into the respective PMOS transistors is expressed by the following expression.

$$I4 = \alpha \times I2 \quad \text{(Expression 25)}$$

The current mirror ratio α is a value determined based on a transistor size ratio. The detailed description of the current mirror ratio α is omitted because it is known. The current mirror ratio α corresponds to a proportional constant α in a first embodiment of the present invention. The current I2 flowing into the PMOS transistor 24 is equal to a current I26 flowing through the resistor 26.

$$I2 = I26 \quad \text{(Expression 26)}$$

Therefore, the following expression is obtained from (Expression 25) and (Expression 26).

$$I4 = \alpha \times R22/(R21+R22)/R26 \times VDD \quad \text{(Expression 27)}$$

Thus, the current I4 specified by the current I2 generated by the current source circuit 2 flows into each of the PMOS transistors 41 and 42.

The current I4 is used as the charging current or the discharging current to charge or discharge the capacitor 31.

When the signal ΦG is in the high level, a high-level signal is inputted to the gate of the NMOS transistor 81 to turn on the NMOS transistor 81, so the first switch circuit 8 is turned on. Then, the drain and the source of the NMOS transistor 43 are electrically connected with each other, so the level of each of the gates of the NMOS transistors 43, 44, and 45 becomes lower. Therefore, the current does not flow into each of the NMOS transistors 43, 44, and 45. Thus, all the current I4 from the PMOS transistor 42 flows into the capacitor 31 to charge the capacitor 31.

On the other hand, when the signal ΦG is in the low level, a low-level signal is inputted to the gate of the NMOS transistor 81 to turn off the NMOS transistor 81, so the first switch circuit 8 is turned off. Thus, all the current I4 from the PMOS transistor 41 flows into the NMOS transistor 43.

Each of a combination of the NMOS transistors 43 and 44 and a combination of the NMOS transistors 43 and 45 is configured as a current mirror circuit having commonly-connected gates and the NMOS transistors are equal in size to one another. Therefore, a current equal in magnitude to the current I4 flowing into the NMOS transistor 43 flows into each of the NMOS transistors 44 and 45. A sum of the currents flowing into the NMOS transistors 44 and 45 is 2×I4 and corresponds to the discharging current of the capacitor 31. At this time, the charging current I4 flows into the capacitor 31 because of the current I4 from the PMOS transistor 42. As a result, the discharging current (magnitude) I4 flows from the capacitor 31.

Thus, the current I4 is used as the charging current or the discharging current to charge or discharge the capacitor 31. When the signal ΦG is in the high level, the capacitor 31 is charged. When the signal ΦG is in the low level, the capacitor 31 is discharged.

According to an actual circuit of the triangular wave generating circuit described in JP 2004-253868 A, the discharging MOS transistors are used as constant current elements. When the capacitor is being charged, the gate potentials of the discharging MOS transistors are set to 0 V to turn off the discharging MOS transistors, thereby performing the charging and discharging control.

However, in the case of discharging in the triangular wave generating circuit described in JP 2004-253868A, in order to increase the gate potentials of the discharging MOS transistors from 0 V to a potential required to operate the discharging MOS transistors as the constant current elements again, it is necessary to perform charging with a very small current because of the circuit structure. Therefore, there is a problem that a time lag of several tens of nanoseconds occurs between the time of input of a discharging start signal and the time of start of actual discharging.

This problem will be described with reference to FIGS. 5 and 6. FIG. 5 is a corresponding circuit diagram showing the circuit which includes the current source circuit 2, the charging and discharging circuit 4, the first switch circuit 8, and the capacitor 3 in the triangular wave generating circuit of FIG. 4.

The NMOS transistors 44 and 45 shown in FIG. 4 correspond to an NMOS transistor M1 shown in FIG. 5. The NMOS transistor 43 shown in FIG. 4 corresponds to an NMOS transistor M2 shown in FIG. 5. The NMOS transistor 81 constituting the first switch circuit 8 shown in FIG. 4 corresponds to an NMOS transistor M3 shown in FIG. 5. The capacitor 31 shown in FIG. 4 corresponds to a capacitor C31 shown in FIG. 5.

Assume that current sources corresponding to the PMOS transistors 41 and 42 of FIG. 4 through which the currents flow are current source circuits V41 and V42 shown in FIG. 5.

In FIG. 5, a signal obtained by inverting the signal ΦG described with reference to FIG. 3 or 4 is referred to as a signal "compout". The signal "compout" is inputted to a gate of the NMOS transistor M3 through an inverter INV1.

The signal "compout" is, for example, a signal from a connection point between the output terminal of the inverter 73 and the input terminal of the inverter 74 as shown in FIG. 4.

In the case of FIG. 4, the NMOS transistors 43, 44, and 45 are equal in size to one another and the currents flowing through the PMOS transistors 41 and 42 are equal in magnitude to each other. In contrast to this, the case where the NMOS transistors M1 and M2 are equal in size to each other and a current ratio between the current source circuits V41 and V42 is 2:1 will be described with reference to FIG. 5.

As described above, the NMOS transistor M2 corresponds to a single NMOS transistor which is the NMOS transistor 43, the NMOS transistor M1 corresponds to two NMOS transistors which are the NMOS transistors 44 and 45, and the NMOS transistors 43, 44, and 45 are equal in size to one another. Therefore, when the NMOS transistors M1 and M2 are equal in size to each other, the current ratio is used to make the discharging and the charging of the capacitor 3 identical to each other.

The reason why the ratio as described above is used is that a potential increase rate and a potential reduction rate with respect to time of the triangular wave generated by the triangular wave generating circuit are set to the same value to make a potential increase time equal to a potential reduction time, that is, a duty ratio of the triangular wave is set to 50%.

Therefore, the circuit shown in FIG. 5 performs the same operation as that of the circuit including the current source circuit 2, the charging and discharging circuit 4, the first switch circuit 8, and the capacitor 3, which is described with reference to FIG. 4.

Next, the operation of the circuit shown in FIG. 5 will be described in detail with reference to FIG. 6. In the description, assume that a current flowing through the NMOS transistor M1 is expressed by I1, a current flowing into the NMOS transistor M3 is expressed by Iref, and a potential at a node A is expressed by VA. In addition, assume that the output signal from the output terminal OUT shown in FIG. 3, that is, an output voltage from a connection point between the capacitor C31 and a drain of the NMOS transistor M1 in FIG. 5 is expressed by "ramp".

The node A is a connection point at which a gate of the NMOS transistor M1 is connected with a gate of the NMOS transistor M2. The node A is also a connection point at which a drain of the NMOS transistor M2, a source of the NMOS transistor M3, and the current source circuit V41 are connected with one another.

The NMOS transistors M1 and M2 are on/off-controlled based on whether the potential VA at the node A is in the high level or the low level.

When the signal "compout" is in the low level, a high-level signal obtained by inverting the signal "compout" by the inverter INV1 is inputted to a gate of the NMOS transistor M3 to turn on the NMOS transistor M3.

Then, a drain and the source of the NMOS transistor M3 are electrically connected with each other, so the potential VA at the node A connected with the gates of the NMOS transistors M1 and M2 becomes the low level. Therefore, the currents do not flow through the NMOS transistors M1 and M2.

Thus, all the current from the current source circuit V42 flows into the capacitor C31 to charge the capacitor C31.

This period corresponds to a period T1 shown in FIG. 6. During the period T1, the signal "compout" is in the low level, so the potential VA is in the low level and each of the currents Iref and I1 is substantially 0. During the period T1, the capacitor C31 is charged over time with a constant current from the current source circuit V42, so the voltage of the output signal "ramp" from the output terminal OUT connected with the capacitor C31 linearly increases.

At this time, a constant current from the current source circuit V41 flows into a ground point through the node A and the NMOS transistor M3 because the NMOS transistors M2 and M1 are turned off and the NMOS transistor M3 is turned on.

When the signal "compout" is in the high level, a low-level signal obtained by inverting the signal "compout" by the inverter INV1 is inputted to the gate of the NMOS transistor M3 to turn off the NMOS transistor M3.

Because the NMOS transistor M3 is turned off, the constant current flowing from the current source circuit V41 into the ground point through the node A and the NMOS transistor M3 is prevented from flowing through the NMOS transistor M3. Therefore, the potential VA at the node A is increased by the constant current from the current source circuit V41.

When the potential VA at the node A increases and thus exceeds a threshold gate voltage of the NMOS transistors M2 and M1, the NMOS transistors M2 and M1 are turned on.

When the NMOS transistor M1 is turned on, the current I1 starts to flow from the NMOS transistor M1, so the discharging of the capacitor C31 starts.

This period corresponds to a period T2 shown in FIG. 6. During the period T2, the potential VA is increased from the low level to the high level in response to a time when the signal "compout" becomes the high level. When the potential VA exceeds a threshold gate-source voltage of the NMOS transistors M2 and M1, the current I1 starts to flow from the NMOS transistor M1, so the discharging of the capacitor C31 starts. Therefore, the voltage of the output signal "ramp" from the output terminal OUT connected with the capacitor C31 linearly reduces.

As described with reference to FIG. 3, when the voltage of the output signal "ramp" linearly reduces (voltage VOUT which is the potential of the output signal "ramp" reduces) and thus becomes lower than VE (=VL), that is, VOUT<VE, the voltage VOUT increases with the lapse of time. A period between the start of reduction in the output signal "ramp" and the start of increase therein corresponds to a period T3.

The operations during the periods T1 to T3 are repeated to change the voltage VOUT, that is, the output signal "ramp" to a triangular wave.

The following problem occurs during the period T2. There is a time between the time when the signal "compout" becomes the high level and the time when the voltage of the output signal "ramp" from the output terminal OUT connected with the capacitor C31 starts to linearly reduce. In other words, a time lag occurs between the time of input of the discharging start signal and the time of start of actual discharging.

An ideal output signal for starting the discharging with no time lag in response to the discharging start signal is shown in FIG. 6 as an ideal output signal "ramp".

A time when the output signal "ramp" starts to reduce is expressed by t1 and a potential at this time is expressed by H1. A time when the ideal output signal "ramp" starts to reduce is expressed by t2 and a potential at this time is expressed by H2.

A time lag δT is expressed by t2—t1. The time lag δT is equal to a time length of the period T2. There is the following problem with respect to the time lag δT. When a length of each of the periods T1 and T3 is long, a ratio of the time lag δT to the length of each of the periods T1 and T3 is small, so the influence of the time lag δT is small. However, when the cycle of a triangular wave to be generated becomes faster to shorten the length of each of the periods T1 and T3, the ratio of the time lag δT to the length of each of the periods T1 and T3 becomes larger. Therefore, a designed triangular wave cannot be generated.

In other words, a problem occurs in which a high-frequency triangular wave cannot be generated because there is the time lag between the time of input of the discharging start signal and the time of start of actual discharging.

A switching regulator using the triangular wave generated by the triangular wave generating circuit with the time lag has a problem that a designed pulse duty ratio for controlling the output voltage is not obtained.

There is also a problem that not the ideal potential H2 but the potential H1 is outputted because of the time lag δT. The capacity of the capacitor C31 has an upper limit and a lower limit, so the capacitor C31 becomes saturated during the period T2. Therefore, there is the case where the potential of the capacitor C31 cannot linearly increase. In such a case, a problem occurs in which an outputted wave becomes a trapezoidal wave.

Thus, when the time lag occurs between the time of input of the discharging start signal and the time of start of actual discharging as described above, there are a problem that the output of the triangular wave generating circuit cannot be generated at a normal ratio in response to the discharging start signal and a problem that the high-frequency triangular wave cannot be generated by the triangular wave generating circuit.

SUMMARY OF THE INVENTION

The present invention has been made in view of the circumstances described above. An object of the present invention is to provide a triangular wave generating circuit capable of reducing a time lag between the time of input of a discharging start signal and the time of start of actual discharging.

The present invention has been made to attain the above object. According to a first aspect of the invention, there is provided a triangular wave oscillation circuit, including: a first current source circuit for generating a current; a capacitor; a reference voltage circuit for generating a plurality of reference voltages; a comparator circuit for comparing a voltage of the capacitor with the plurality of reference voltages to output a switching signal for switching between charging and discharging of the capacitor based on a result obtained by comparison; a charging and discharging circuit for performing one of the charging and discharging of the capacitor with the current specified by the first current source circuit in response to the switching signal from the comparator circuit; and a switch circuit for switching between the plurality of reference voltages in response to the switching signal from the comparator circuit, in which the charging and discharging circuit includes: an inverter circuit for inverting the switching signal from the comparator circuit; a discharging reference potential generating circuit for generating a discharging reference potential which is a reference potential for discharging the capacitor; a first NMOS transistor having a drain connected with a connection point between the first current source circuit and the capacitor, and a gate connected with the discharging reference potential generated by the discharging reference potential generating circuit; a second NMOS transistor having a gate inputted with the switching signal through the inverter circuit, a drain connected with the gate of the first NMOS transistor, and a source connected with a source of the first NMOS transistor; and a third NMOS transistor having a gate inputted with the switching signal, a drain connected with a connection point between the source of the first NMOS transistor and the source of the second NMOS transistor, and a source grounded.

According to a second aspect of the present invention, in the triangular wave oscillation circuit according to the first aspect of the present invention, when the capacitor is charged, the charging and discharging circuit operates such that the second NMOS transistor is turned on and the third NMOS transistor is turned off to make potentials of the source and the gate of the first NMOS transistor equal to the discharging reference potential, and the drain and the source of the first NMOS transistor are electrically disconnected with each other by operation of the charging and discharging circuit to charge the capacitor with the current from the first current source circuit.

According to a third aspect of the present invention, in the triangular wave oscillation circuit according to the second aspect of the present invention, when the capacitor is discharged, the charging and discharging circuit operates such that the second NMOS transistor is turned off and the third NMOS transistor is turned on to make the potential of the source of the first NMOS transistor lower than the discharging reference potential which is the potential of the gate of the first NMOS transistor, and the drain and the source of the first NMOS transistor are electrically connected with each other by operation of the charging and discharging circuit to discharge the capacitor.

According to a fourth aspect of the present invention, in the triangular wave oscillation circuit according to any one of the first to third aspects of the present invention, the discharging reference potential generating circuit includes: a second current source circuit for generating a current; a fourth NMOS transistor having a drain connected with the second current source circuit; and a fifth NMOS transistor having a drain connected with a source of the fourth NMOS transistor, a source grounded, and a gate applied with a power supply voltage, the gate of the first NMOS transistor is connected with a gate of the fourth NMOS transistor, and a connection point between the second current source circuit and the drain of the fourth NMOS transistor is connected with a connection point between the gate of the fourth NMOS transistor and the gate of the first NMOS transistor.

According to the present invention, a new switching MOS transistor is connected in series with a discharging MOS transistor. A gate of the discharging MOS transistor is maintained at a potential close to a potential capable of operating the discharging MOS transistor as a constant current element. Therefore, an effect is obtained in which a triangular wave generating circuit capable of reducing a time lag between the time of input of a discharging start signal and the time of start of actual discharging can be provided.

In the triangular wave generating circuit, the time lag between the time of input of the discharging start signal and the time of start of actual discharging can be reduced. Therefore, an effect is obtained in which a frequency of a triangular wave generated by the triangular wave generating circuit can be increased.

DETAILED DESCRIPTION OF THE PREFERRED EMBODIMENT

Figure 1:
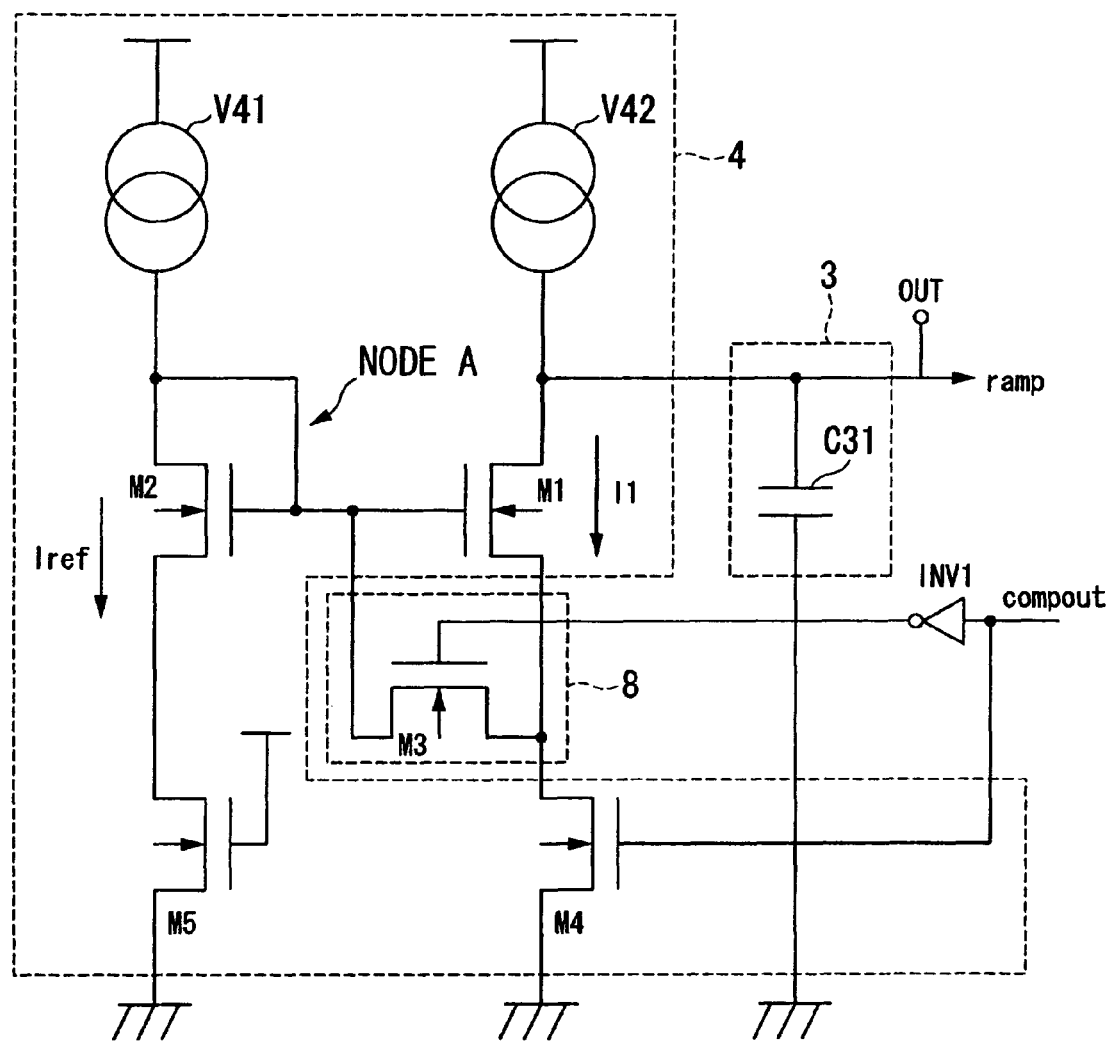
FIG. 1 is a circuit diagram showing a charging and discharging circuit according to an embodiment of the present invention.

Hereinafter, an embodiment of the present invention will be described with reference to the attached drawings. FIG. 1 is a circuit diagram showing a triangular wave generating circuit according to the embodiment of the present invention.

Figure 5:
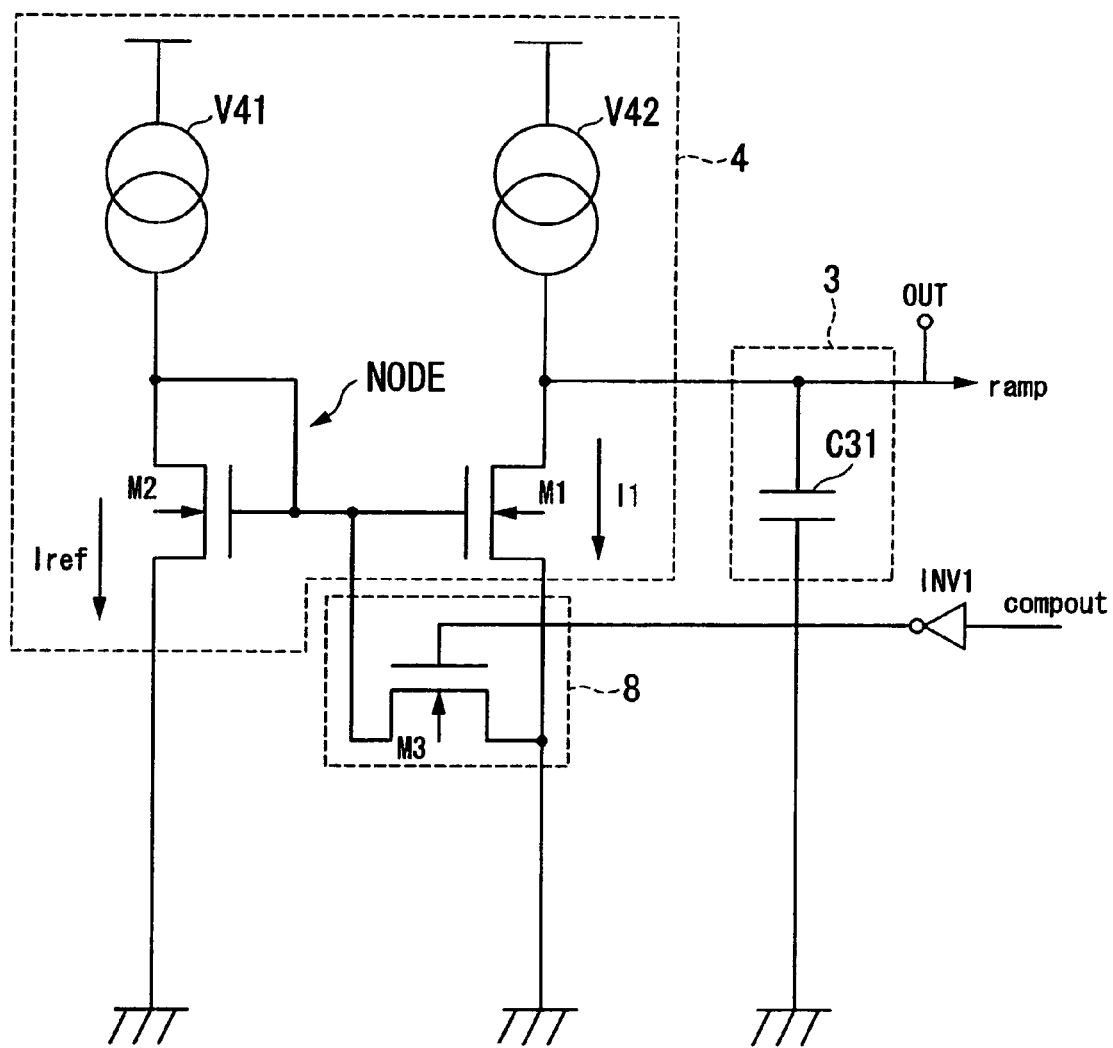
FIG. 5 is a circuit diagram showing an example of a conventional charging and discharging circuit of the triangular wave generating circuit of FIG. 4.

In FIG. 1, parts corresponding to the respective parts shown in FIG. 5 are expressed by the same symbols and thus the description thereof is omitted here. The case where a duty ratio of a triangular wave generated by the triangular wave generating circuit is 50% will be described.

The triangular wave generating circuit shown in FIG. 1 is different from the triangular wave generating circuit shown in FIG. 5 in the point that the triangular wave generating circuit further includes NMOS transistors M4 and M5. The NMOS transistor M4 includes a gate to which the signal "compout" (switching signal) is directly inputted, a drain connected with the sources of the NMOS transistors M1 and M3, and a source is grounded. The NMOS transistor M5 includes a drain connected with the source of the NMOS transistor M2, a source is grounded, and a gate connected with a power supply voltage terminal for turning on the gate of the NMOS transistor M5.

The NMOS transistor M5 is always on because the gate thereof is connected with the power supply voltage terminal.

In other words, the triangular wave oscillation circuit includes the current source circuit V42 (first current source circuit) for generating a current, the capacitor C31, a reference voltage circuit 5 for generating a plurality of reference voltages, a comparator circuit 6 for comparing the voltage of the capacitor C31 with a reference voltage to generate the signal "compout" for switching between charging and discharging of the capacitor C31 based on a result obtained by comparison, the charging and discharging circuit 4 for charging or discharging the capacitor C31 with the current specified by the current source circuit V42 based on the signal "compout" from the comparator circuit 6, and the second switch circuit 9 for switching between the plurality of reference voltages based on the signal "compout" from the comparator circuit 6.

In this embodiment, assume that the charging and discharging circuit 4 includes the first switch circuit 8.

As shown in FIG. 1, the charging and discharging circuit 4 includes the inverter INV1 (inverter circuit) for inverting the signal "compout" from the comparator circuit 6, a discharging reference potential generating circuit for generating a discharging reference potential which is a reference potential for discharging the capacitor C31, the NMOS transistor M1 (first NMOS transistor), the NMOS transistor M3 (second NMOS transistor), and the NMOS transistor M4 (third NMOS transistor). The drain of the NMOS transistor M1 is connected with a connection point between the current source circuit V42 and the capacitor C31 and the gate thereof is supplied with the discharging reference potential generated by the discharging reference potential generating circuit. The gate of the NMOS transistor M3 is inputted with the signal "compout" through the inverter INV1, the drain thereof is connected with the gate of the NMOS transistor M1, and the source thereof is connected with the source of the NMOS transistor M1. The gate of the NMOS transistor M4 is inputted with the signal "compout", the drain thereof is connected with a connection point between the source of the NMOS transistor M1 and the source of the NMOS transistor M3, and the source thereof is grounded.

In the charging and discharging circuit 4 of the triangular wave oscillation circuit, when the capacitor C31 is to be charged, the NMOS transistor M3 becomes on-state and the NMOS transistor M4 becomes off-state. Then, the potential of the source of the NMOS transistor M1 and the potential of the gate thereof becomes equal to the discharging reference potential, so the drain and the source of the NMOS transistor M1 are electrically disconnected with each other. Therefore, the capacitor C31 is charged with the current from the current source circuit V42. The current for charging the capacitor C31 is referred to as a charging current "I".

In the charging and discharging circuit 4 of the triangular wave oscillation circuit, when the capacitor C31 is to be discharged, the NMOS transistor M3 becomes off-state and the NMOS transistor M4 becomes on-state. Then, the potential of the source of the NMOS transistor M1 becomes lower than the discharging reference potential of the gate thereof, so the drain and the source of the NMOS transistor M1 are electrically connected with each other to discharge the capacitor C31. The current discharging from the capacitor C31 is referred to as the discharging current I1.

The discharging reference potential generating circuit of the triangular wave oscillation circuit includes the current source circuit V41 (second current source circuit) for generating a current, the NMOS transistor M2 (fourth NMOS transistor) whose drain is connected with the current source circuit V41, and the NMOS transistor M5 (fifth NMOS transistor) whose drain is connected with the source of the NMOS transistor M2, source is grounded, and gate is applied with the power supply voltage.

The gate of the NMOS transistor M2 is connected with the gate of the NMOS transistor M1. A connection point between a drain (output terminal) of the current source circuit V41 and the drain of the NMOS transistor M2 is connected with a connection point between the gate of the NMOS transistor M2 and the gate of the NMOS transistor M1 in a zone 4 surrounded by a dotted line.

The NMOS transistor M5 is an NMOS transistor which corresponds to the NMOS transistor M4 to thereby set the current mirror ratio to the same value for characteristic matching. The NMOS transistor M5 is always on.

This embodiment will describe the case where a potential increase rate and a potential reduction rate of the triangular wave generated by the triangular wave generating circuit are set to the same value to make a potential increase time equal to a potential reduction time, that is, the case where the duty ratio of the generated triangular wave is set to 50%.

When the duty ratio of the generated triangular wave is 50%, for example, an output current ratio between the current source circuits V41 and V42 is set to 2:1, a size ratio between the NMOS transistors M2 and M1 is set to 1:1, and a size ratio between the NMOS transistors M5 and M4 is set to 2:1.

<Principle of Operation>

Next, The principle of the operation of the circuit shown in FIG. 1 will be described with reference to FIG. 2.

The potential at the node A is determined based on the reference current Iref and a K value of the NMOS transistor M2. When a K value of the NMOS transistor M5 is set to a sufficiently large value, a drain-source voltage Vds of the NMOS transistor M5 can be neglected. Therefore, the potential at the node A, that is, a gate-source voltage Vgs of the NMOS transistor M2 is calculated by Expression 1 described below.

$$Vgs=(Iref/K)^{(1/2)}+Vth \qquad \text{(Expression 1)}$$

In Expression 1, Vth indicates a threshold voltage of the NMOS transistor M2 and K indicates a dielectric constant of the NMOS transistor M2. The dielectric constant K is calculated by Expression 2 described below.

$$K=(W/L)\times \mu 0 \times Cox \qquad \text{(Expression 2)}$$

In Expression 2, W indicates a gate width, L indicates a gate length, μ0 indicates mobility, and Cox indicates a gate unit capacitance.

The potential at the node A is determined using Expression 1. The NMOS transistor M3 and the NMOS transistor M4 are alternately turned on, so no current flows into the ground point through the NMOS transistor M3.

The reference current Iref is constantly flowing, so the potential at the node A becomes a constant voltage. In FIG. 2, the potential VA at the node A momentarily reduces at the instant when the output signal "ramp" turns upward. This momentarily reduction is caused by capacitive coupling which occurs when the level of the gate of the NMOS transistor M3 is reduced from the high (H) level to the low (L) level.

Therefore, the voltage value Vgs determined by Expression 1 is constantly applied to the gate potential of the NMOS transistor M1.

As described above, the potential at the node A is constantly held, so charging and discharging with a very small current is not performed.

<Method of Controlling Turning On/Off of NMOS Transistor M1>

Next, a method of controlling the turning on/off of the NMOS transistor M1 will be described.

When the NMOS transistor M3 is on-state and the NMOS transistor M4 is off-state, the source potential of the NMOS transistor M1 is equal to the potential at the node A.

That is, a gate-source voltage Vgs of the NMOS transistor M1 is 0 V, so the NMOS transistor M1 is in an off-state. Even at this time, the potential at the node A does not change.

Then, when the NMOS transistor M3 becomes off-state and the NMOS transistor M4 becomes on-state, it is necessary to rapidly reduce the source potential of the NMOS transistor M1 to 0 V before the current starts to flow into the NMOS transistor M1. In this case, charges stored in the source potential of the NMOS transistor M1 are discharged by the NMOS transistor M4. For example, when a parasitic capacitance of the source of the NMOS transistor M1 is 1 pF and an ON-resistance of the NMOS transistor M4 is 100Ω, a time required for which a discharging amount reaches approximately 99% is 500 picoseconds (=5×1 p×100).

<Comparison with Conventional Technique>

In contrast to this, the method according to the conventional technique in which the potential at the node A is reduced to the ground voltage (GND) to turn off the NMOS transistor M1 will be described. A period "t" between a time when the NMOS transistor M1 becomes off-state and a time when the potential at the node A increases to allow the current to flow again, that is, the time lag "t" can be assumed to be a time required to increase a both-end voltage of a parasitic capacitance of the node A to the voltage determined using Expression 1 by charging with a constant current. Therefore, when a parasitic capacitance value "C" of the node A is 1 pF, a stable potential V at the node A is 1 V, and the reference current Iref is 1 μA, as is apparent from Expression 3 described below, the required time is 1 μs.

$$t=CV/Iref \qquad \text{(Expression 3)}$$

In order to minimize the time lag "t" as much as possible in the method according to the conventional technique, an increase in the reference current Iref is expected from Expression 3. However, the reference current Iref is one of factors for determining an oscillation frequency "f" as in the case of the capacitor C31.

When the charging current is expressed by "I", the discharging current is expressed by "αI" (=I1), a capacitance value of the capacitor C31 is expressed by "C", and a peak value of the output signal "ramp" is expressed by "V", the oscillation frequency "f" is determined using Expression 5 described below. The coefficient α is a coefficient indicating a ratio between the charging current and the discharging current in the case where the charging current I is set to 1.

$$f=(1+\alpha)I/CV \qquad \text{(Expression 5)}$$

There is a proportional relationship between the reference current Iref and the discharging current αI. Therefore, as is apparent from Expression 5, in order to increase the reference current Iref while the oscillation frequency is held to a constant value, it is necessary to increase both the reference current Iref and the capacitance value of the capacitor C31. A maximum limit of the capacitance value of the capacitor C31 is determined in view of the limited chip size of a semiconductor integrated circuit, so the degree of freedom of a range in which the reference current Iref can be increased is small.

Therefore, it is apparent that there is a limitation on a range in which the reference current Iref can be increased to shorten the time lag "t".

It is expected from Expression 3 that the parasitic capacitance value "C" is reduced to minimize the time lag "t". However, a transistor size of the NMOS transistors M1 and M2 which is a dominant factor of the parasitic capacitance value "C" is determined based on the following factor. Therefore, there is a limitation to reduce the parasitic capacitance value "C".

Next, the point that there is a limitation to reduce the parasitic capacitance value "C" will be described.

It is required that the NMOS transistor M1 operates in a saturation region even in the case where the output signal "ramp" is at a lower limit voltage.

An operation condition in the saturation region is calculated using Expression 4 described below in the case where a drain-source voltage of the NMOS transistor M1 is expressed by Vds.

$$Vds \geq Vgs-Vth \qquad \text{(Expression 4)}$$

The threshold voltage Vth is a fixed value. In order to operate the NMOS transistor in the saturation region to a lower drain-source voltage Vds, it is necessary to adjust the gate-source voltage Vgs to a voltage close to the threshold voltage Vth. The gate-source voltage Vgs of the NMOS transistor M1 is equal to the potential at the node A and determined using Expression 1 based on the K value of the NMOS transistor M2 and the reference current Iref.

As is apparent from Expression 1, when the K value of the NMOS transistor M2 increases, the drain-source voltage Vds of the NMOS transistor M1 can be reduced. In order to increase the K value, there may be a case where the gate length L is shortened and a case where the gate width W is widened.

In the case where the gate length L is shortened, there is a lower limit for shortening because the manufacturing process capacity is limited. Therefore, the K value is to be increased by widening the gate width W.

However, the widening of the gate width W causes an increase in transistor size, thereby increasing the parasitic capacitance value in the node A.

Therefore, there is a limitation to reduce the parasitic capacitance value C in the node A by reducing the transistor size. It is apparent that there is a limitation on a range in which the parasitic capacitance value C in the node A can be reduced to shorten the time lag "t".

Thus, according to the method in the conventional technique, because there is a limitation to increase the reference current Iref and there is a limitation to reduce the parasitic capacitance value, it is apparent that there is a limitation to shorten the time lag "t" of Expression 3.

In contrast to this, according to this embodiment, the potential at the node A which is the gate voltage of the NMOS transistor M1 is constantly held to the constant potential determined using Expression 1 based on the reference current Iref and the K value of the NMOS transistor M2. The source potential of the NMOS transistor M1 is rapidly discharged into the NMOS transistor M4 with a relatively low resistance. Therefore, the gate-source voltage Vgs of the NMOS transistor M1 rapidly becomes equal to the gate-source voltage Vgs of the NMOS transistor M2, so the current mirror operation can be performed with the NMOS transistor M2. Thus, it is possible to shorten the time lag "t" between the time of input of the discharging start signal and the time of start of discharging the capacitor C31.

<Operation>

Next, the operation of the circuit shown in FIG. 1 will be described with reference to FIG. 2.

When the signal "compout" is in the low level, a high-level signal obtained by inverting the signal "compout" by the inverter INV1 is inputted to the gate of the NMOS transistor M3 to turn on the NMOS transistor M3.

At the same time, the signal "compout" in the low level is inputted to the gate of the NMOS transistor M4 to turn off the NMOS transistor M4.

Accordingly, the drain and the source of the NMOS transistor M3 are electrically connected with each other and the drain and the source of the NMOS transistor M4 are electrically disconnected with each other.

Because the drain and the source of the NMOS transistor M4 are electrically disconnected with each other, no current flows through a circuit including the NMOS transistors M1 and M4. Therefore, the constant current from the current source circuit V42 flows into the capacitor C31, with the result that charges are stored in the capacitor C31 to charge the capacitor C31.

Figure 2:
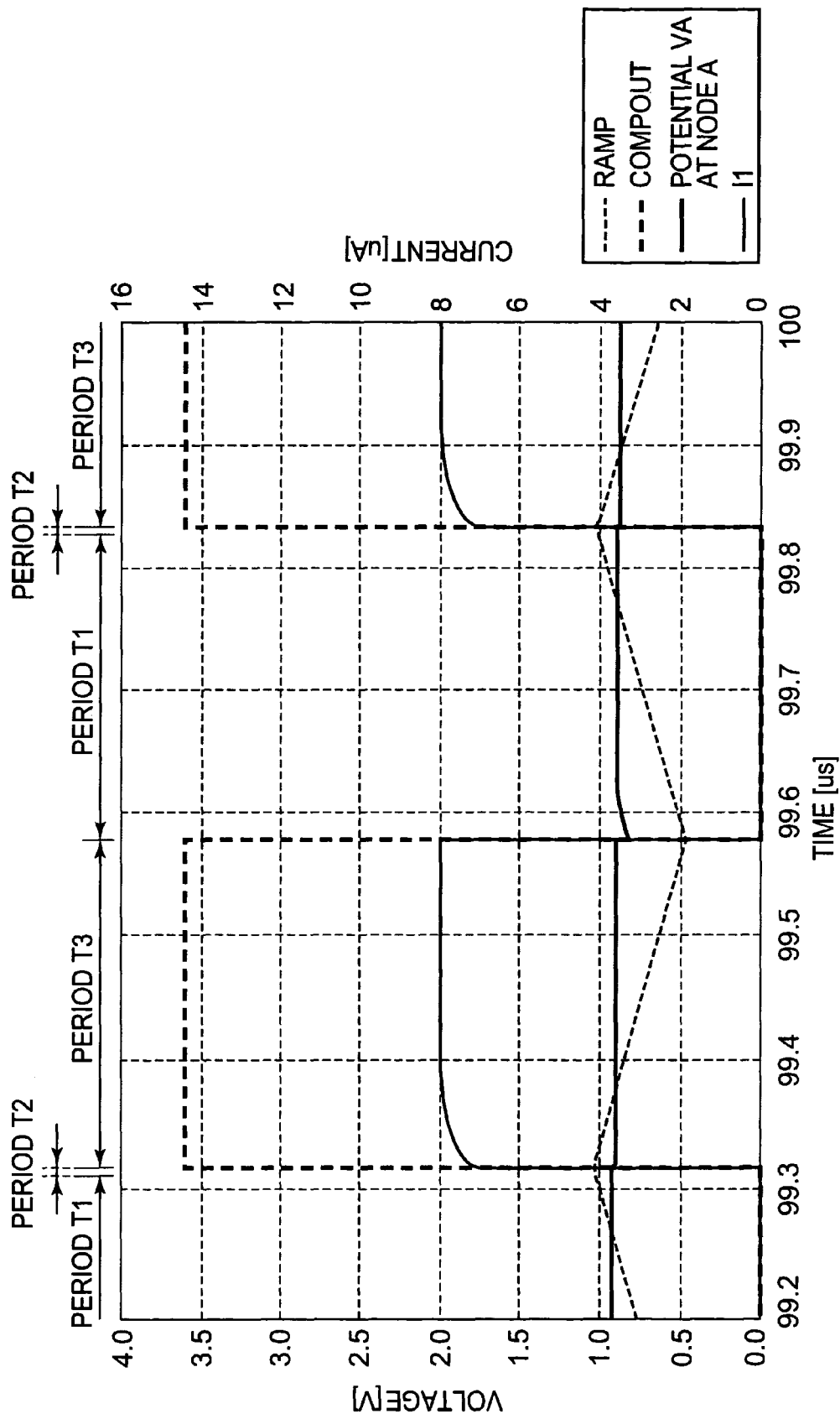
FIG. 2 is a diagram showing an operation of the charging and discharging circuit of FIG. 1.

This period corresponds to a period T1 shown in FIG. 2. During the period T1, the signal "compout" is in the low level, so the potential VA, that is, the potential at the node A which is described using Expression 1 is held to a substantially constant potential determined based on the reference current Iref and the K value of the NMOS transistor M2.

During the period T1, the capacitor C31 is charged over time with the constant current from the current source circuit V42, so the voltage of the output signal "ramp" from the output terminal OUT connected with the capacitor C31 linearly increases.

When the signal "compout" becomes the high level, a low-level signal obtained by inverting the signal "compout" by the inverter INV1 is inputted to the gate of the NMOS transistor M3 to turn off the NMOS transistor M3. At the same time, the signal "compout" in the high level is inputted to the gate of the NMOS transistor M4 to turn on the NMOS transistor M4.

Then, the drain and the source of the NMOS transistor M3 are electrically disconnected with each other and the drain and the source of the NMOS transistor M4 are electrically connected with each other.

Because the NMOS transistor M3 is turned off, the source of the NMOS transistor M1 is electrically separated from the node A. Because the NMOS transistor M4 becomes on-state in addition to the electrical separation, the source potential of the NMOS transistor M1 is rapidly discharged to 0 V.

Therefore, the NMOS transistor M1 is turned on and the charges stored in the capacitor C31 are discharged through the sources and the drains of the NMOS transistors M1 and M4.

This period corresponds to a period T2 shown in FIG. 2. During the period T2, when the signal "compout" becomes the high level, the NMOS transistor M3 is turned off, the NMOS transistor M4 is turned on, and the source potential of the NMOS transistor M1 becomes 0V. Then, the current starts to flow into the NMOS transistor M2, so the discharging from the capacitor C31 starts. Therefore, the voltage of the output signal "ramp" from the output terminal OUT connected with the capacitor C31 linearly reduces.

Figure 6:
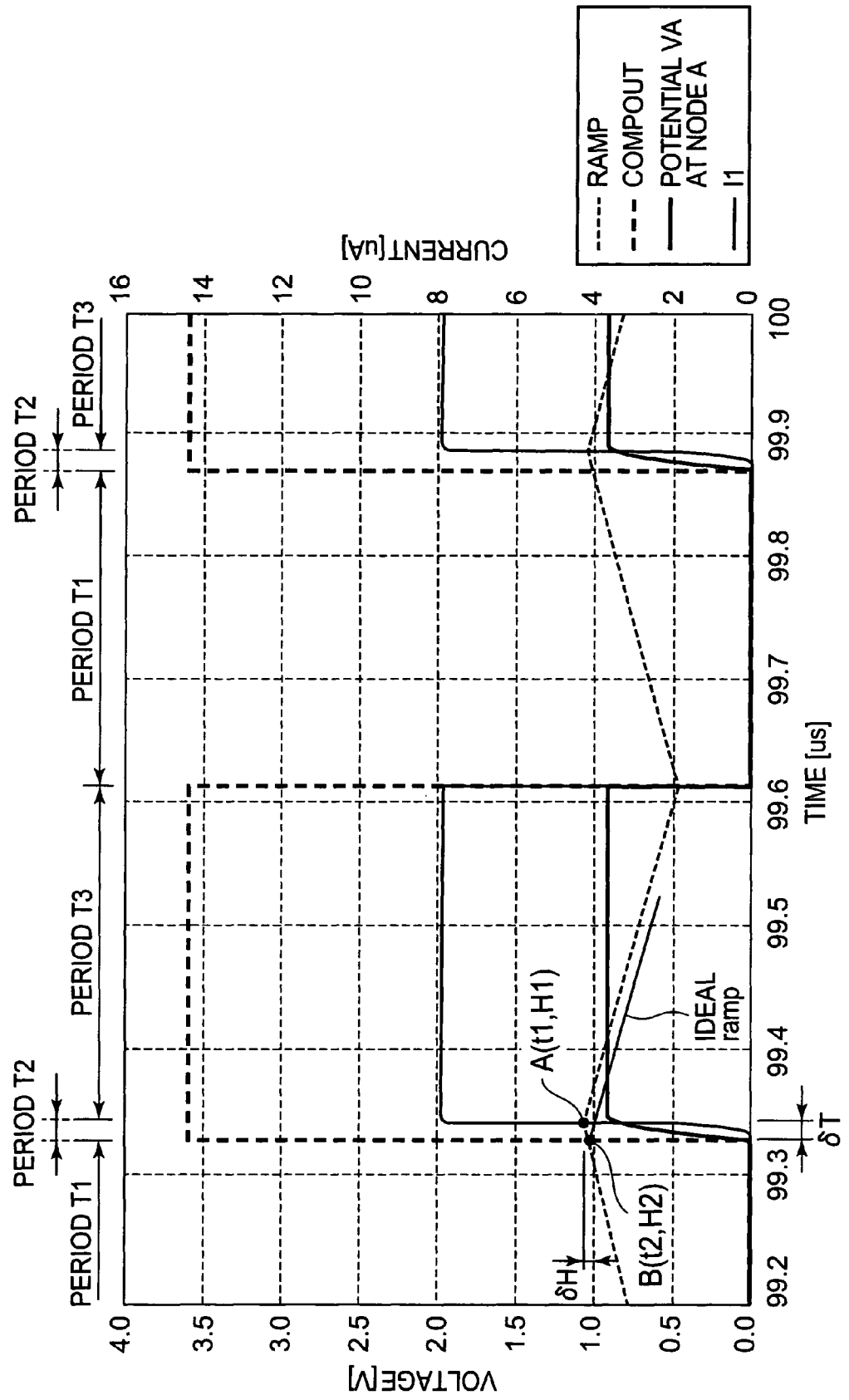
FIG. 6 is a diagram showing an operation of the charging and discharging circuit of FIG. 5.

The period T2 of FIG. 2 is shorter in length than the period T2 of FIG. 6.

In the conventional technique shown in FIG. 6, during the period T2, the potential VA increases from the low level (potential 0) to the threshold gate voltage of the NMOS transistor M1 to start the discharging of the capacitor C31.

In contrast to this, in this embodiment, the potential at the node A, that is, the gate-source voltage Vgs of the NMOS transistor M2 is held to the constant potential determined using Expression 1 based on the reference current Iref and the K value of the NMOS transistor M2.

Therefore, when this embodiment shown in FIG. 2 is compared with the conventional technique shown in FIG. 6, the period T2 in this embodiment is shorter in length than the period T2 in the conventional technique, that is, the time lag "t" is shortened.

In other words, according to the charging and discharging circuit 4 shown in FIG. 5, the gate potential of the NMOS transistor M1 is adjusted between the low level and the high level to charge or discharge the capacitor C31. In contrast, according to the charging and discharging circuit 4 shown in FIG. 1, the gate potential of the NMOS transistor M1 is held to a constant value. The source potential of the NMOS transistor M1 is adjusted by the NMOS transistors M3 and M2 so as to become equal to the constant gate potential or become lower than the constant gate potential, thereby charging or discharging the capacitor C31.

Because the method of controlling the NMOS transistor M1 is different from the method according to the conventional technique, the time lag between the time of input of the discharging start signal and the time of start of actual discharging can be reduced in the charging and discharging circuit 4 shown in FIG. 1.

Figure 3:
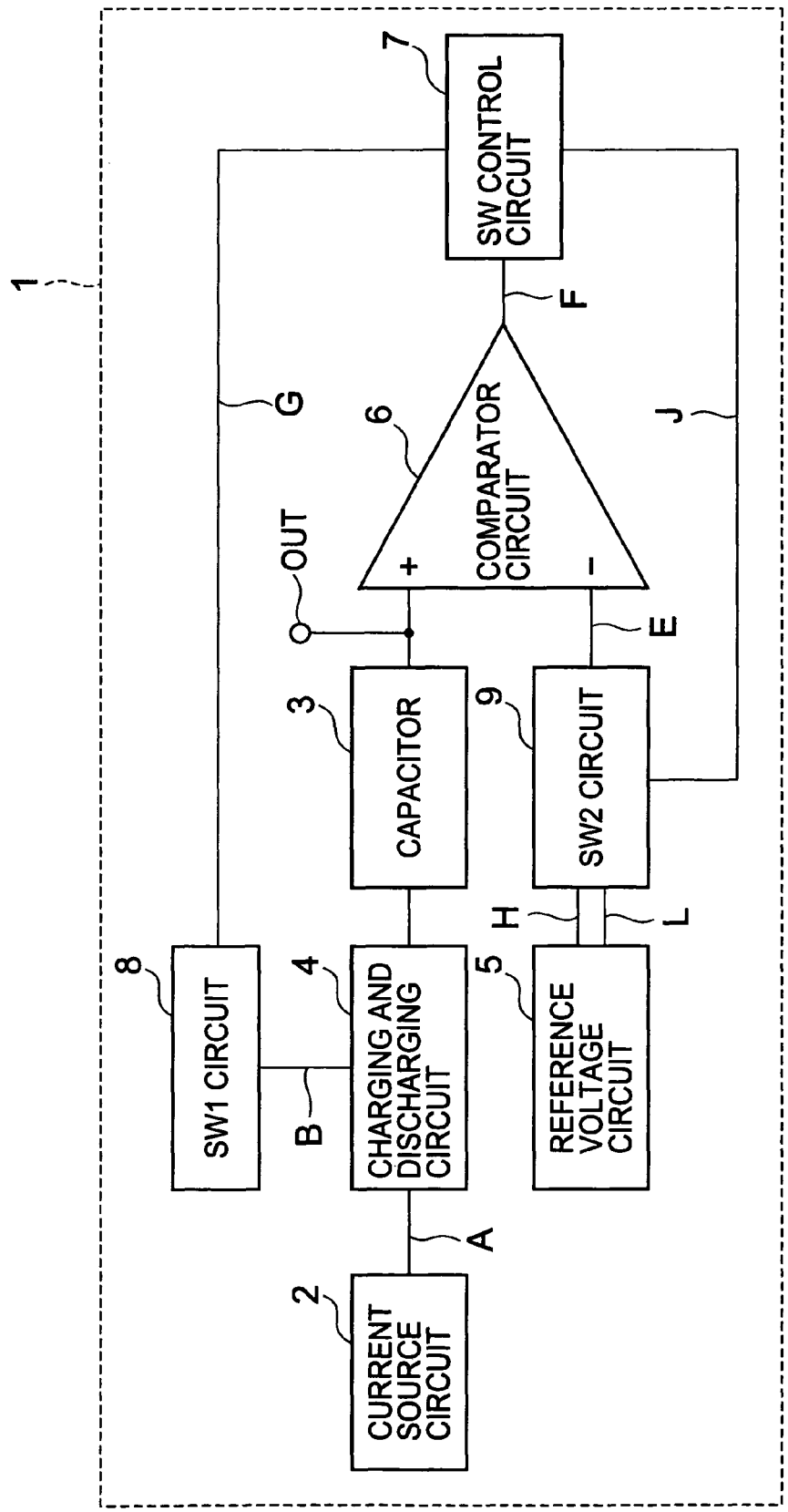
FIG. 3 is a circuit diagram showing an example of a conventional triangular wave generating circuit.

As in the case described with reference to FIG. 3, the voltage of the output signal "ramp" linearly reduces, and the voltage VOUT which is the potential of the output signal "ramp" reduces. Then, when the voltage VOUT becomes lower than VE (=VL), which means VOUT<VE, the voltage VOUT increases with the lapse of time.

Hereinafter, the operation during the periods T1, T2, and T3 is repeated by the triangular wave generating circuit to generate the voltage VOUT, that is, the output signal "ramp" as a triangular wave signal.

Therefore, according to the triangular wave generating circuit in this embodiment, the time lag between the time of input of the discharging start signal and the time of start of actual discharging can be reduced.

The case where the duty ratio of the triangular wave generated by the triangular wave generating circuit is 50% is described in the above description. However, the present invention is not limited to this case. The duty ratio of the triangular wave generated by the triangular wave generating circuit is a value determined based on design. The output currents from the current source circuits V42 and V41 are set based on the duty ratio determined as a design value.

The size ratio between the NMOS transistor M1 and M2 and the size ratio between the NMOS transistor M4 and M5 are set based on the design value of the duty ratio of the triangular wave.

The size ratio between the NMOS transistor M1 and M2 and the size ratio between the NMOS transistor M4 and M5 may be set based on the output current ratio between the current source circuits V42 and V41.

Figure 4:
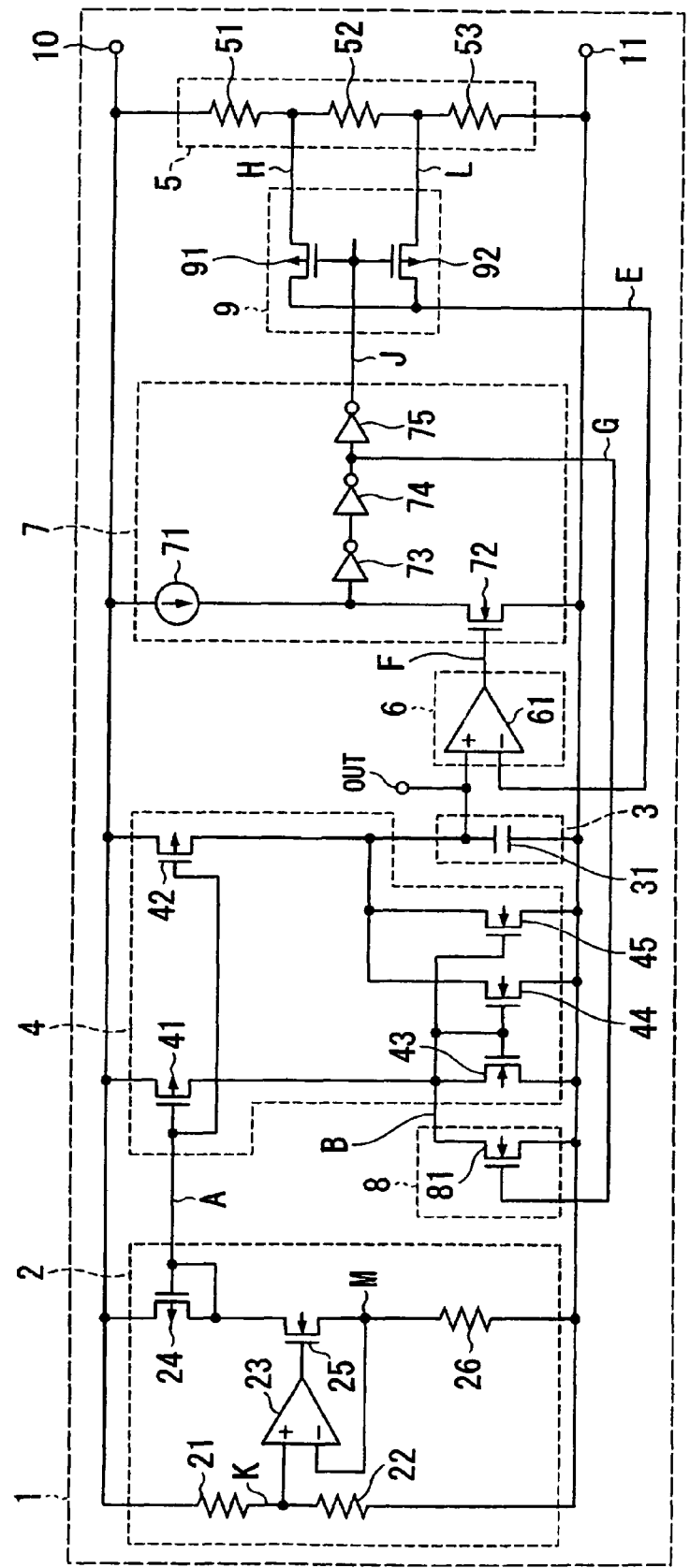
FIG. 4 is a circuit diagram showing an example of the triangular wave generating circuit of FIG. 3.

In the circuit of FIG. 1 according to this embodiment, for example, the signal "compout" is outputted from the connection point between the inverters 73 and 74 shown in FIG. 4. The signal "compout" is inputted to the gate of the NMOS transistor M3 through the inverter INV1 shown in FIG. 1. The signal "compout" shown in FIG. 1 is inputted to the gate of the NMOS transistor M4. However, the inverter INV1 is not necessarily provided. For example, the following operation may be employed. A signal "compoutA" is outputted from the connection point between the inverters 73 and 74 shown in FIG. 4. The signal "compoutA" is inputted to the gate of the NMOS transistor M4 shown in FIG. 1. A signal "compoutB" is outputted from the connection point between the inverters 74 and 75 shown in FIG. 4. The signal "compoutB" is inputted to the gate of the NMOS transistor M3 shown in FIG. 1.

In contrast to this, the following operation may also be employed. The signal "compout" is outputted from the connection point between the inverters 73 and 74 shown in FIG. 4. The signal "compout" is inputted to the gate of the NMOS transistor M3 shown in FIG. 1. The signal "compout" is inputted to the gate of the NMOS transistor M4 through the inverter INV1 shown in FIG. 1.

In other words, it is important that the signal inputted to the gate of the NMOS transistor M3 and the signal inputted to the gate of the NMOS transistor M4 are inverted to each other.

The case on the assumption that the triangular wave generating circuit is applied to a switching regulator is described. However, the present invention is not limited to this case and thus can be applied to arbitrary devices.

The embodiment of the present invention is described in detail with reference to the attached drawings. However, specific structures are not limited to the embodiment and thus include designs made without departing from the scope of the present invention The present invention is suitable for use in a triangular wave generating circuit.

What is claimed is:

1. A triangular wave oscillation circuit, comprising:
    a first current source circuit for generating a current;
    a capacitor;
    a reference voltage circuit for generating a plurality of reference voltages;
    a comparator circuit for comparing a voltage of the capacitor with the plurality of reference voltages to output a switching signal for switching between charging and discharging of the capacitor based on a result obtained by the comparison;
    a charging and discharging circuit for performing one of the charging and discharging of the capacitor with the current specified by the first current source circuit in response to the switching signal from the comparator circuit; and
    a switch circuit for switching between the plurality of reference voltages in response to the switching signal from the comparator circuit,
    wherein the charging and discharging circuit includes:
        an inverter circuit for inverting the switching signal from the comparator circuit;
        a discharging reference potential generating circuit for generating a discharging reference potential which is a reference potential for discharging the capacitor;
        a first NMOS transistor having a drain connected with a connection point between the first current source circuit and the capacitor, and a gate connected with the discharging reference potential generated by the discharging reference potential generating circuit;
        a second NMOS transistor having a gate to which the switching signal is inputted through the inverter circuit, a drain connected with the gate of the first NMOS transistor, and a source connected with a source of the first NMOS transistor; and
        a third NMOS transistor having a gate to which the switching signal is inputted, a drain connected with a connection point between the source of the first NMOS transistor and the source of the second NMOS transistor, and a source grounded.

2. An triangular wave oscillation circuit according to claim 1, wherein when the capacitor is charged:
    the charging and discharging circuit operates such that the second NMOS transistor is turned on and the third NMOS transistor is turned off to make potentials of the source and the gate of the first NMOS transistor equal to the discharging reference potential; and
    the drain and the source of the first NMOS transistor are electrically disconnected with each other by operation of the charging and discharging circuit to charge the capacitor with the current from the first current source circuit.

3. An triangular wave oscillation circuit according to claim 1, wherein when the capacitor is discharged:
    the charging and discharging circuit operates such that the second NMOS transistor is turned off and the third NMOS transistor is turned on to make the potential of the source of the first NMOS transistor lower than the discharging reference potential which is the potential of the gate of the first NMOS transistor; and
    the drain and the source of the first NMOS transistor are electrically connected with each other by operation of the charging and discharging circuit to discharge the capacitor.

4. An triangular wave oscillation circuit according to claim 1, wherein:
the discharging reference potential generating circuit includes:
a second current source circuit for generating a current;
a fourth NMOS transistor having a drain connected with the second current source circuit; and
a fifth NMOS transistor having a drain connected with a source of the fourth NMOS transistor, a source grounded, and a gate applied with a power supply voltage;
the gate of the first NMOS transistor is connected with a gate of the fourth NMOS transistor; and
a connection point between the second current source circuit and the drain of the fourth NMOS transistor is connected with a connection point between the gate of the fourth NMOS transistor and the gate of the first NMOS transistor.

* * * * *